United States Patent
Nabetani

(10) Patent No.: US 6,618,610 B2
(45) Date of Patent: Sep. 9, 2003

(54) RF COIL, SHIELD AND MAGNETIC RESONANCE IMAGING APPARATUS

(75) Inventor: Akira Nabetani, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/798,868

(22) Filed: Mar. 1, 2001

(65) Prior Publication Data

US 2001/0028222 A1 Oct. 11, 2001

(30) Foreign Application Priority Data

Mar. 30, 2000 (JP) .......................... 2000-093833

(51) Int. Cl.[7] ................................ A61B 5/05
(52) U.S. Cl. ..................................... 600/422
(58) Field of Search ................. 600/422, 421, 600/410, 407, 411, 412, 413, 414, 415, 416, 417, 418, 419, 420; 324/319; 333/219; 355/209

(56) References Cited

U.S. PATENT DOCUMENTS

| | | | | | |
|---|---|---|---|---|---|
| 4,638,252 | A | * | 1/1987 | Bradshaw | 324/318 |
| 5,111,819 | A | * | 5/1992 | Hurd | 600/410 |
| 5,201,311 | A | * | 4/1993 | Bottomley et al. | 600/422 |
| 5,378,989 | A | * | 1/1995 | Barber et al. | 324/318 |
| 5,557,247 | A | * | 9/1996 | Vaughn, Jr. | 333/219 |
| 5,617,859 | A | * | 4/1997 | Souza et al. | 600/420 |
| 5,680,046 | A | * | 10/1997 | Frederick et al. | 324/318 |
| 5,696,449 | A | * | 12/1997 | Boskamp | 324/318 |
| 5,715,822 | A | * | 2/1998 | Watkins et al. | 600/422 |
| 5,801,609 | A | * | 9/1998 | Laskaris et al. | 335/216 |
| 6,184,684 | B1 | * | 2/2001 | Dumoulin et al. | 324/318 |
| 6,249,121 | B1 | * | 6/2001 | Boskamp et al. | 324/318 |
| 6,437,567 | B1 | * | 8/2002 | Schenck et al. | 324/318 |

FOREIGN PATENT DOCUMENTS

| | | |
|---|---|---|
| EP | 0290187 | 11/1988 |
| EP | 0471509 | 2/1992 |

OTHER PUBLICATIONS

JT Vaughn, "An improved volume coil for high field MRI" Proceedings of the society for magnetic resonance in Medicine Seventh scientific meeting, Phila, PA, May 22–28, 1999, vol. 1, p. 167.

* cited by examiner

*Primary Examiner*—Daniel Robinson
(74) *Attorney, Agent, or Firm*—Moonray Kojima

(57) ABSTRACT

A TEM resonator RF coil with excellent operating characteristics comprising a plurality of ring segments on the orifice capable of being segmented by slits on the orifice are installed with a first conducting pattern connecting to the line element, a second conducting pattern disposed symmetrically on the left and right of the first conducting pattern, a capacitor connecting these conducting patterns, and a connection means spanning the adjacent ring segments and connecting the second conducting patterns.

10 Claims, 15 Drawing Sheets

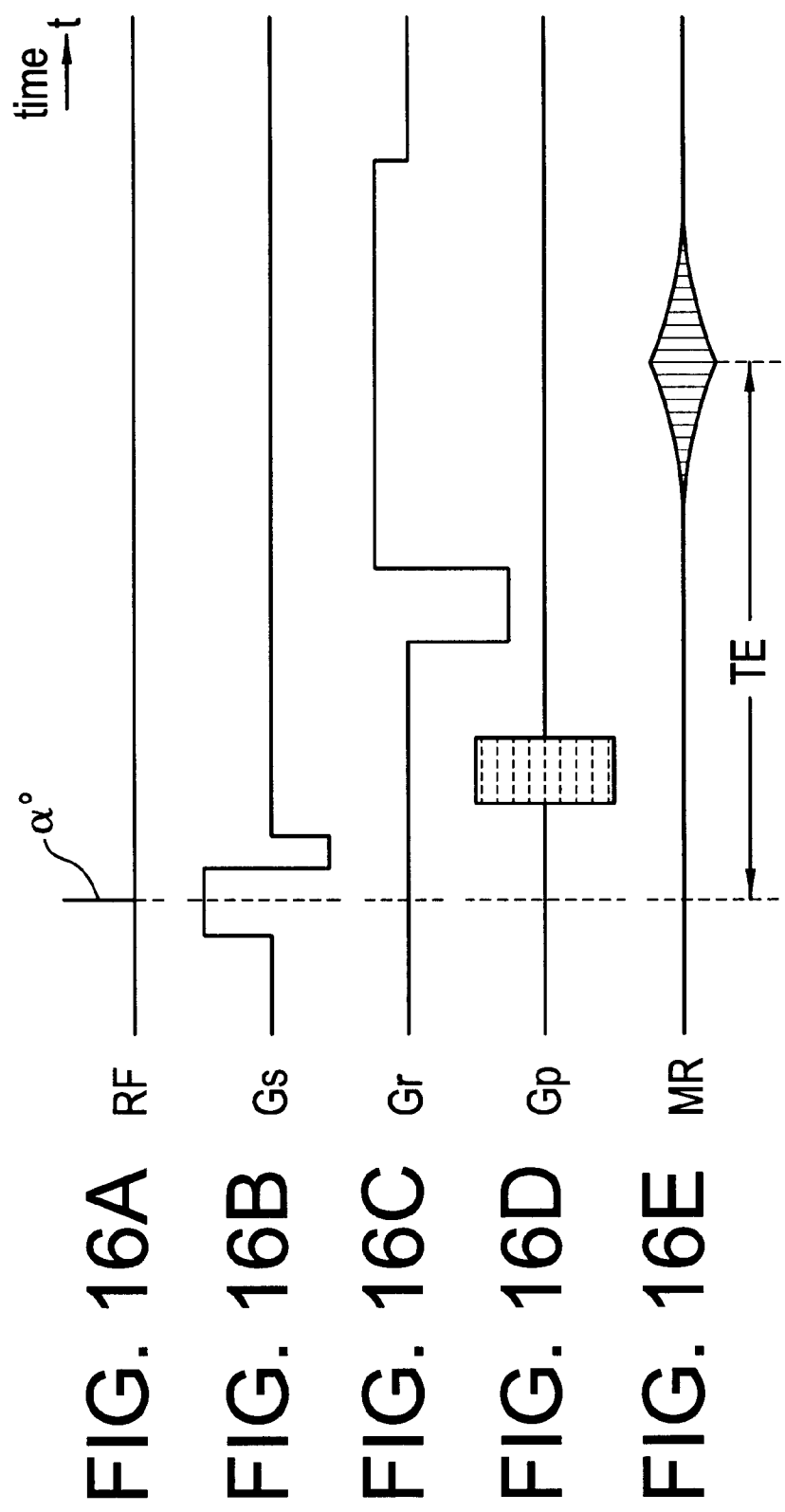

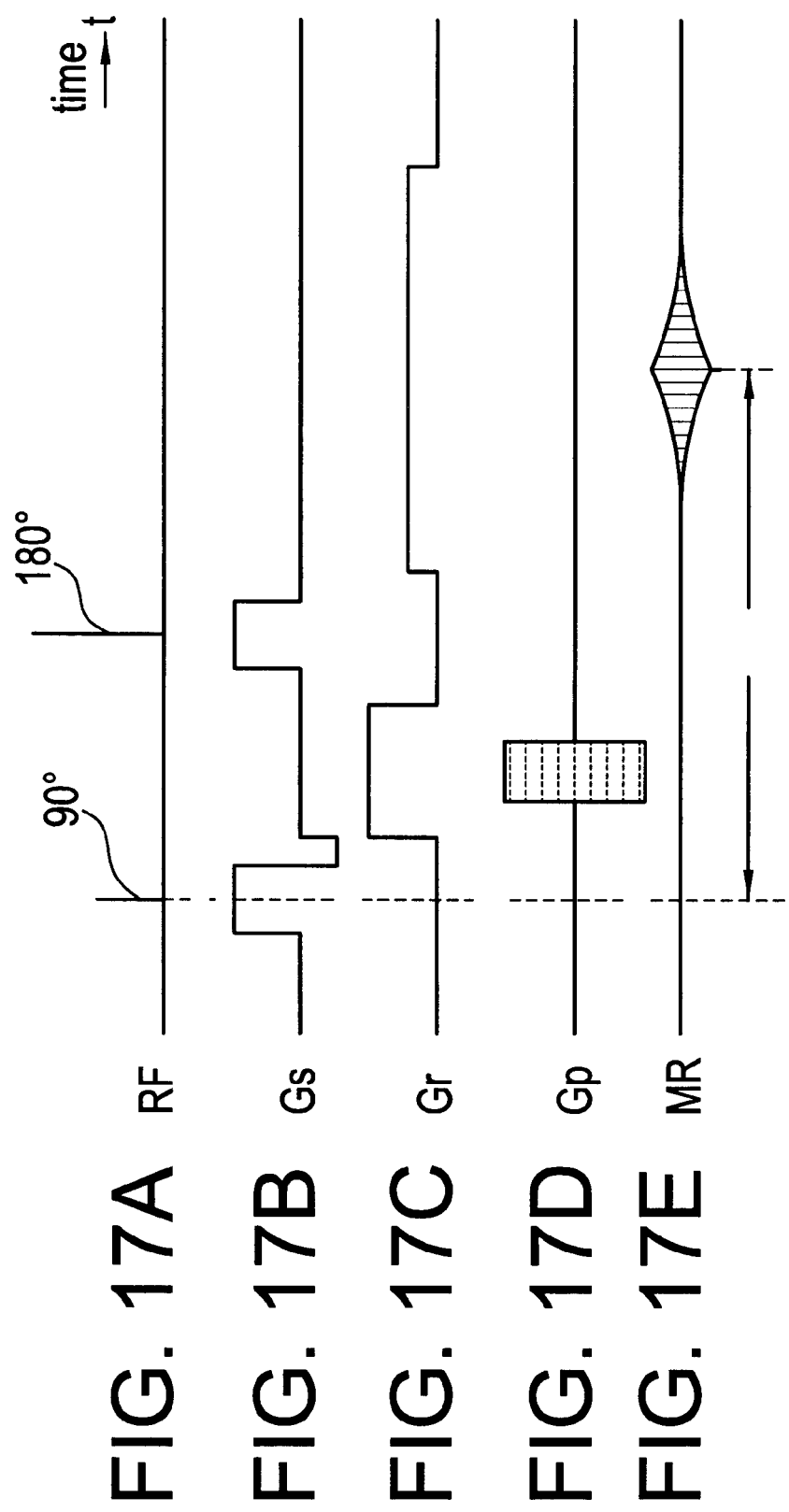

RF COIL, SHIELD AND MAGNETIC RESONANCE IMAGING APPARATUS

BACKGROUND OF THE INVENTION

The present invention relates to an RF (radio frequency) coil, shield and a magnetic resonance imaging apparatus, and particularly relates to a TEM (transverse electromagnetic mode) resonator RF coil, a shield used to adjust TEM RF coils, and a magnetic resonance imaging apparatus using the TEM resonator RF coil.

In magnetic resonance imaging apparatus using for example a high magnetic field of approximately 3 T (tesla) as the static magnetic field, TEM resonator RF coils are utilized on account of a high RF (radio frequency) signal transmit/receive efficiency to receive magnetic resonance signals occurring from spin excitation and RF excitation of the spin of the imaging target.

The TEM resonator RF coil has a cylindrical tube 700 as shown in FIG. 1. Both ends of the tube 700 have orifices 702, 702'. The orifices 702, 702' have openings 704, 704' concentrically formed with a smaller inner diameter than the inner diameter of the tube 700.

The tube 700 and the orifices 702, 702' are formed with consecutive conductive elements. Tube bodies having a tube 700 and orifice 702, 702' of this kinds are called shields or cavities.

A plurality of line elements 802 are disposed on the inner side of the shield in parallel with the shield axis. The line elements 802 form an LC series circuit. Both ends of the plural line elements 802 are respectively coupled mechanically and electrically to the orifices 702, 702', and arranged concentrically along the periphery of the openings 704, 704'. The line elements 802 are separated from the inner side of the tube 700.

A rotating RF magnetic field is generated within the surface axially perpendicular to the columnar space enclosed by the line elements 802, by supplying an RF signal to specified locations of an RF coil of this structure. The RF signal (magnetic resonance signal) generated by the rotating spin on the same plane is extracted from specified positions of this RF coil.

In actual magnetic resonance imaging, the shield is separated into a plurality of slits 706 in the axial and radial directions as shown for example in FIG. 2. Each of the shield segments separated by the slits 706 are electrically isolated, preventing excess current from flowing along the outer periphery of the shield during application of a magnetic field gradient, and preventing disturbances in the static magnetic field during excess current flow.

In the RF coil having the shield separated by slits, the shield effect is decreased because both ends of the orifices 702, 702' are separated into individual segments by the slits 706. When this kind of RF coil is used as the head coil for capturing images of the cranium, the neck section of the target image is added as an external load to the other orifice so that the electrical characteristics are asymmetrical along the coil axis and the RF coil operation tends to be unstable.

To achieve stable operation, capacitors 122 are disposed to connect the adjoining shield segments on both ends of the orifices 702, 702' of the shield as shown in FIG. 3.

Capacitors used as the capacitor 122 have for example, sufficient high impedance in a frequency region of 1 kilohertz to 10 kilohertz and for example, sufficiently low impedance in the frequency range of approximately 128 megahertz.

The orifices 702, 702' connected by such capacitors are equivalent to an electrical short in the RF region across the slit 706. A plurality of the line elements 802 therefore have a value equivalent to conductive elements each jointly connected on both ends, so the shield effect in the RF region is improved, and operation is stabilized regardless of whether a load is present or absent in the vicinity of the orifices 702, 702'.

In the 1 kilohertz to 10 kilohertz frequency region on the other hand, the capacitor 122 has a sufficiently high impedance so that excess current does not flow to the outer periphery during application of a magnetic field gradient forming the signal in the same frequency range. Therefore the effect of excess current on the static magnetic field can be prevented.

The RF coil imaging object can be easily input and output so that a two-segment structure along the axis can be formed as shown for example in FIG. 4, and both segments joined by a connector. In such a case, the width of the slit 706 in the connector joint must be wider than the other sections so that the static electrical coupling in that section is weak and the shield effect deteriorates.

In the joint of the connector 124, the slits 706, 706' are respectively rotated into both shield segment sides as shown for example in FIG. 5, conductive foil lands 126, 126' are respectively formed, and electrically connected to the connector 124, and the slits 706, 706' respectively bridged to the capacitors 122, 122'. In this way a sufficient static electrical connection can be maintained in the segments.

In the above segmented TEM resonator RF coil, the conductive pattern for electrical connection to the connectors is different from the conductive pattern of other RF coils so that the circuits in the segments have poor uniformity, and the operating characteristics as an RF coil deteriorate.

SUMMARY OF THE INVENTION

It is an object of the present invention to provide a TEM resonator RF coil with excellent operating characteristics, a shield for adjusting this type of RF coil, and a magnetic resonance imaging apparatus using this TEM resonator RF coil.

(1) To solve the above problems, in a first aspect of the invention, a TEM resonator RF coil is comprised of a cylindrical shield having a ring-shaped orifice at both ends, a plurality of line elements connected at both ends to the orifice and arranged at equal intervals along an opening of the orifice, a plurality of slits segmenting the shield into two equally portioned positions at line element intervals in parallel along the axis and forming a plurality of ring segments on the orifice, and the plural ring segments are comprised of a first conducting pattern connected to the line elements, a second conducting pattern disposed symmetrically for the line elements in two directions from the line elements towards the slit, capacitors connecting the first conducting pattern with the second conducting pattern, and a connection means to electrically connect the second conducting patterns spanning the adjacent ring segments.

In this aspect of the invention, the circuits between the segments are uniform (equivalent) because the plural ring sections made from an orifice segmented by slits, have a first conducting pattern connected to the line elements, a second conducting pattern disposed symmetrically to the first conducting pattern for the line elements, in two directions from the line elements towards the slit.

(2) In another aspect of the invention to solve the above problems, the RF coil according to (1) is characterized in that the shield can be divided into two portions at the slit locations.

In this aspect of the invention, the shield can be segmented into two portions at the slit locations so that the uniformity of the circuits is continually maintained between segments, and the imaging object can be easily inserted and removed.

(3) In another aspect of the invention to solve the above problems, the RF coil according to (1) is characterized in that the shield can be disassembled into a plurality of cylinder segments per the slit locations.

In this aspect of the invention, the shield can be disassembled into a plurality of cylinder segments at the slit locations so that the uniformity of the circuits is continually maintained between segments, and frequency alignment to the same frequency can be performed in each segment.

(4) In another aspect of the invention to solve the above problems, the TM resonator RF coil comprises a cylindrical shield having a ring-shaped orifice at both ends, a plurality of line elements connected at both ends to the orifice and arranged at equal intervals along the opening of the orifice, a plurality of slits segmenting the shield into two equally portioned positions at line element intervals in parallel along the axis and characterized in that the shield can be disassembled into a plurality of cylinder segments at the slit locations.

In this aspect of the invention, the shield can be disassembled into a plurality of cylinder segments at the slit locations so that frequency alignment to the same frequency can be performed in each segment.

(5) In another aspect of the invention to solve the above problems, the RF coil according to (2) or (4) is characterized in comprising a support means to support the plural cylinder segments so as to constitute a whole cylinder.

In this aspect of the invention, the plural cylinder segments are supported as a whole cylinder by the support means.

(6) In another aspect of the invention to solve the above problems, an RF coil according to (5) is characterized in that the support means can be divided into at least two portions in parallel along the axis.

In this aspect of the invention, the support means can be divided into two portions so the imaging object can be easily inserted and removed.

(7) In another aspect of the invention to solve the above problems, a shield includes a fit portion capable of receiving one cylinder segment for an RF coil according to (3) or (4).

In this aspect of the invention, during frequency alignment of the segments to the same frequency, the shield acquires a jig for fitting the segment into the fit portion.

(8) In another aspect of the invention to solve the above problems, the shield according to (7) coil is characterized in having slits corresponding to the slits in the RF coil according to (3) or (4).

In this aspect of the invention, the shield has slits corresponding to the slits in the RF coil and so is equivalent to the RF coil shield.

(9) In another aspect of the invention to solve the above problems, in a magnetic resonance imaging apparatus for forming images based on magnetic resonance signals acquired by applying a high frequency magnetic field to an object for imaging under a static magnetic field and a gradient magnetic field, an RF coil for at least either applying the high frequency magnetic field or acquiring the magnetic resonance signal is a TEM resonator coil comprised of a cylindrical shield having a ring-shaped orifice at both ends, a plurality of line elements connected at both ends to the orifice and arranged at equal intervals along the opening of the orifice, a plurality of slits segmenting the shield into two equally portioned positions at line element intervals in parallel along the axis and forming a plurality of ring segments on the orifice, and the magnetic resonance imaging apparatus is characterized in that the plural ring segments are respectively comprised of a first conducting pattern connected to the line elements, a second conducting pattern disposed symmetrically for the line elements in two directions from the line elements towards the slits, capacitors connecting the first conducting pattern with the second conducting pattern, and a connection means to electrically connect the second conducting patterns spanning the adjacent ring segments.

In this aspect of the invention, a plurality of ring segments on the orifice capable of being divided by the slits, respectively have a first conducting pattern connecting the line elements, and a second conducting pattern disposed symmetrically for the line elements in two directions from the line elements towards the slit, so that the uniformity of the circuits is continually maintained between segments. By utilizing an RF coil of this type, high quality imaging can be performed.

(10) In another aspect of the invention to solve the above problems, a magnetic resonance imaging apparatus according to (9) is characterized in that the shield can be segmented into two portions at the slit locations.

In this aspect of the invention, the shield can be segmented into two portions at the slit locations so that the uniformity of the circuits is continually maintained between segments, and the imaging object can be easily inserted and removed.

(11) In another aspect of the invention to solve the above problems, a magnetic resonance imaging apparatus according to (9) is characterized in that the shield can be disassembled into a plurality of cylinder segments at the slit locations.

In this aspect of the invention, the shield can be disassembled into a plurality of cylinder segments at the slit locations so that the uniformity of the circuits is continually maintained between segments, and frequency alignment to the same frequency can be performed in each segment. By utilizing an RF coil of this type, high quality imaging can be performed.

(12) In another aspect of the invention to solve the above problems, in a magnetic resonance imaging apparatus for forming images based on magnetic resonance signals acquired by applying a high frequency magnetic field to an object for imaging under a static magnetic field and a gradient magnetic field; an RF coil for at least applying the high frequency magnetic field or acquiring the magnetic resonance signal is a TEM resonator coil comprised of a cylindrical shield having a ring-shaped orifice at both ends, a plurality of line elements connected at both ends to the orifice and arranged at equal intervals along the opening of the orifice, a plurality of slits segmenting the shield into two equally portioned positions at line element intervals in parallel along the axis, and the magnetic resonance imaging apparatus is characterized in using an RF coil with a shield capable of being disassembled into a plurality of cylinder segments at the slit locations.

In this aspect of the invention, the shield can be disassembled into a plurality of cylinder segments at the slit locations so that frequency alignment to the same frequency can be performed in each segment. By utilizing an RF coil of this type, high quality imaging can be performed.

(13) In another aspect of the invention to solve the above problems, a magnetic resonance imaging apparatus according to (11) or (12) is characterized in comprising a support means to support the plural cylinder segments so as to constitute a whole cylinder.

In this aspect of the invention, a plurality of cylinder segments can therefore be supported together as a whole cylinder by the support means.

(14) In another aspect of the invention to solve the above problems, a magnetic resonance imaging apparatus according to (13) is characterized in that the support means can be divided along the axis into at least two portions.

In this aspect of the invention, the support means is divided into two portions so that the imaging object can be easily inserted and removed.

Therefore, the present invention provides a TEM resonator RF coil with excellent operating characteristics, a shield used to adjust the TEM RF coil, and a magnetic resonance imaging apparatus using the TEM resonator RF coil of the invention.

Further objects and advantages of the present invention will be apparent from the following description of the preferred embodiments of the invention as illustrated in the accompanying drawings.

BRIEF DESCRIPTION OF THE DRAWINGS

FIG. 16 is a drawing showing a typical pulse sequence implemented by the apparatus shown in FIG. 6.

FIG. 17 is a drawing showing a typical pulse sequence implemented by the apparatus shown in FIG. 6.

DETAILED DESCRIPTION OF THE INVENTION

Figure 6:
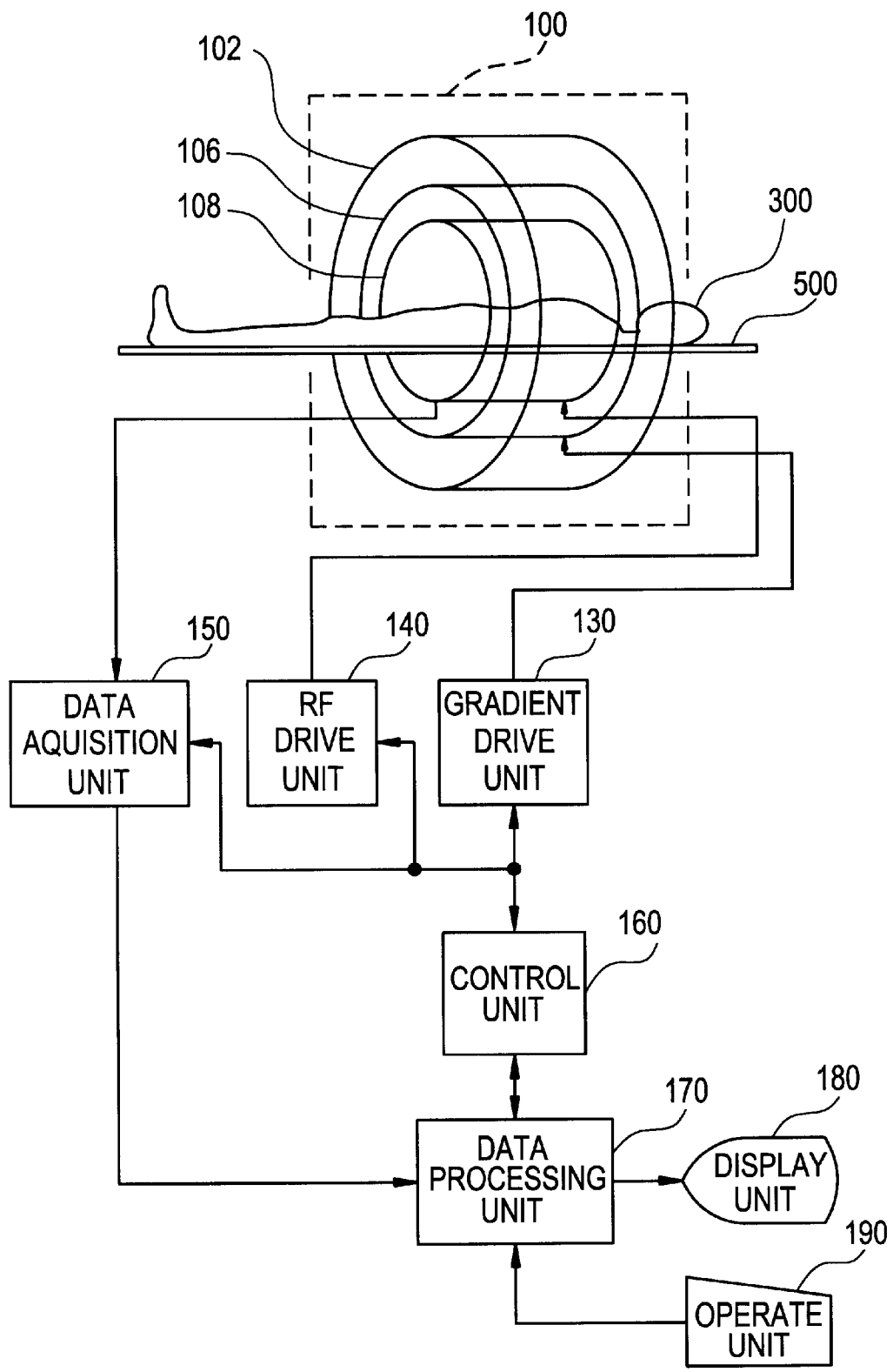
FIG. 6 is a block diagram of one embodiment of the apparatus of the invention.

The embodiments of the present invention are hereafter described in detail while referring to the accompanying drawings. A block diagram of the magnetic resonance imaging apparatus is shown in FIG. 6. This apparatus is an example of the embodiment of the invention. The embodiment relating to the apparatus of the invention is shown by means of the structure of this apparatus.

This apparatus has a magnet system 100 as shown in FIG. 6. The magnet system 100 has a main magnetic field coil unit 102, a gradient coil unit 106 and a RF (radio frequency) coil 108. These coils have a generally cylindrical shape and are mutually arrayed on the same axis. An imaging object 300 is loaded on a cradle 500 in the largely columnar bore (inner space) of the magnet system 100, and carried in and carried out on a carry means not shown in the drawing.

The main magnetic field coil unit 102 forms a static magnetic field in the bore (inner space) of the magnet system 100. The direction of the static field is largely parallel to the body axis of the imaging object 300 or in other words is a horizontal magnetic field. The main magnetic field coil unit 102 is formed using for example, a super-conductive coil. Of course, the present invention is not limited to a super-conductive coil and may use an ordinary conductive coil.

The gradient coil unit 106 generates a gradient magnetic field for making the static magnetic field intensity have a gradient. The generated gradient magnetic field is of three types: a slice gradient field, a readout gradient field and a phase encode gradient magnetic field. The gradient coil unit 106 has a three-system gradient coil (not shown in the drawing) for generating these three types of gradient magnetic fields.

The RF coil unit 108 forms a high frequency magnetic field for excitation for a spin within the body of the imaging object 300 in the static magnetic field space. The forming of a high frequency magnetic field hereafter also refers to transmission of the RF excitation signal. The RF coil unit 108 receives the magnetic waves generated by the spin excitation or in other words receives the magnetic resonance signal. The RF coil unit 108 is one embodiment of the RF coil of the invention. The embodiment of the RF coil of the invention is shown by means of the structure of the RF coil unit 108. The RF coil unit 108 is explained again later in detail.

A gradient drive unit 130 is connected to the gradient coil unit 106. The gradient coil unit 106 applies a drive signal to the gradient coil unit 106 and generates a gradient magnetic field. The gradient drive unit 130 has three system drive circuits not shown in the drawing, corresponding to the three types of gradient coils in the gradient coil unit 106.

The RF drive unit 140 is connected to the RF coil unit 108. The RF drive unit 140 applies a drive signal to the RF coil unit 108 and transmits an RF excitation signal, and causes spin excitation within the body of the imaging object 300.

A data acquisition unit 150 is also connected to the RF coil unit 108. The data acquisition unit 150 is input with the receive signal received by the RF coil unit 108, and collects these signals as view data.

A control unit 160 is connected to the gradient drive unit 130, the RF drive unit 140 and the data acquisition unit 150. The control unit 160 controls the respective gradient drive unit 130 through data acquisition unit 150 and performs imaging.

A data processing unit 170 is connected to the output side of the data acquisition unit 150. The data processing unit 170 is for instance comprised by such as a computer. The data processing unit 170 has a memory not shown in the drawing. The memory stored all types of data and programs for the data processing unit 170. The functions of this apparatus are achieved by running the programs stored in the memory of the data processing unit 170.

The data processing unit 170 stores data input from the data acquisition unit 150 into the memory. The memory is internally has data spaces. The data spaces are comprised of two-dimensional Fourier spaces. The data processing unit 170 performs two-dimensional inverse Fourier conversion of these two-dimensional Fourier spatial data and generates (reconstructs) an image of the imaging object 300. The two-dimensional Fourier space is called a k-space.

The data processing unit 170 is connected to the control unit 160. The data processing unit 170 coordinates the processing in the control unit 160. A display unit 180 and an operating unit 190 are also connected to the data processing unit 170. The display unit 180 is comprised of such as a graphic display. The operating unit 190 is comprised of a keyboard including a pointing device.

The display unit 180 displays the reconstructed image output from the data processing unit 170 and information of various types. The operating unit 190 inputs commands and information of various types to the data processing unit 170 by user operation. The user operates the apparatus interactively by way of the display unit 180 and the operating unit 190.

Figure 7:
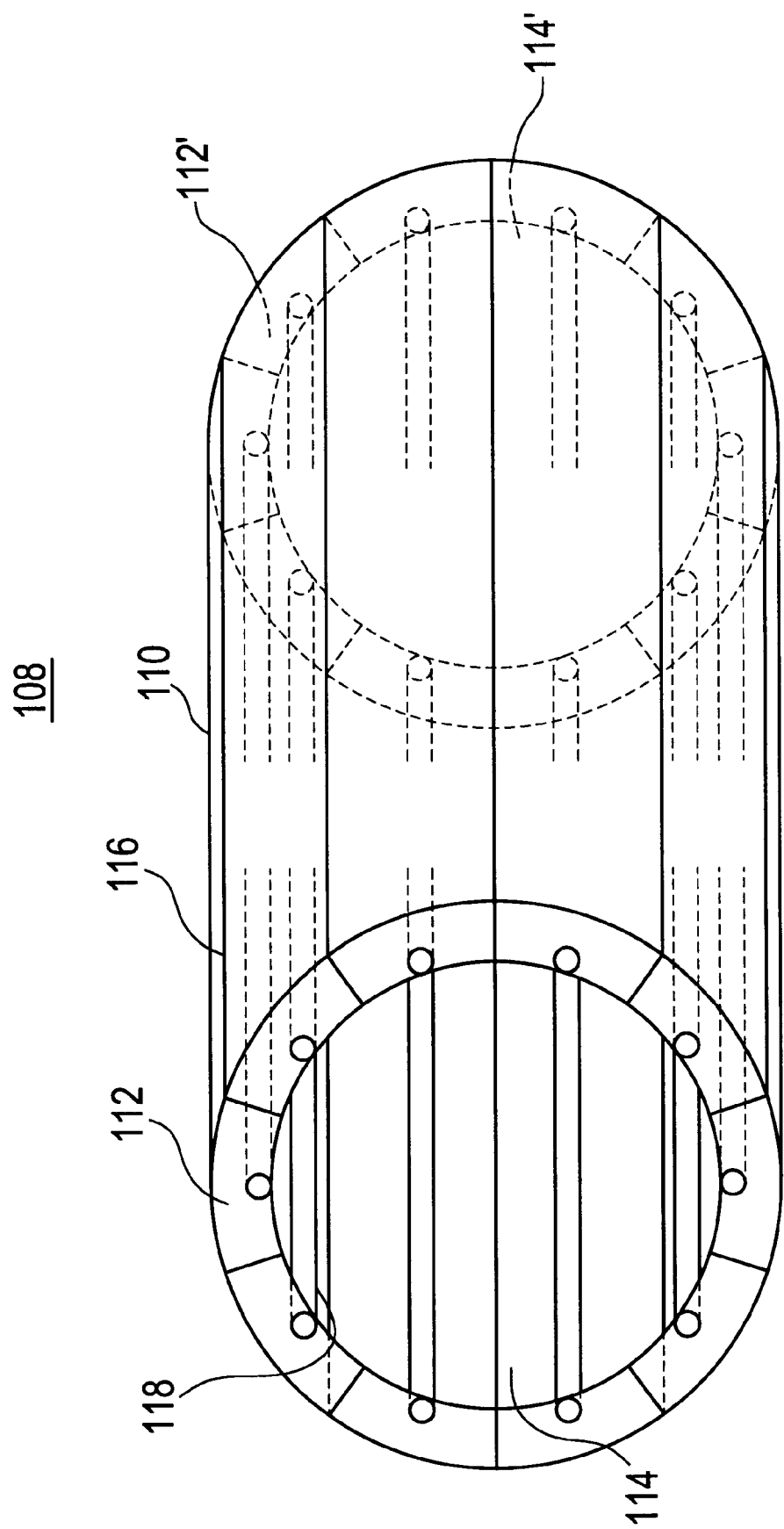
FIG. 7 is a pattern drawing of an RF coil for the apparatus shown in FIG. 6.

The structure of the RF coil unit 108 is shown in FIG. 7. The RF coil unit 108 as shown in the figure, is a TEM resonator RF coil having a structure in common with that shown in FIG. 7.

The RF coil unit 108 described once again, has a cylindrical tube 110. The tube 110 has the orifices 112, 112' on both ends. The orifices 112, 112' have openings 114, 114' concentrically formed with a smaller diameter than the diameter of the tube 110.

The tube 110 and the orifices 112, 112' are comprised of insulator elements such as plastics covered with conductive foil in a plurality of equivalent portions by means of the axial and radial slits 116. The coding of the slit is shown in one location. The tube bodies holding such a tube 110 and the orifices 112, 112' comprise a shield or a cavity. This shield is an example of the embodiment of the shield of the invention. The slit 116 is one example of the embodiment of the slit of this invention.

A plurality of line elements 118 are formed in parallel with the axis on the inner side of the shield. The coding onto the line element is shown in one location. The line element 118 is one example of the embodiment of the line element of the invention.

The line element 118 is formed of a bar shaped conductor having capacitors (not shown in drawing) in the center in series, and along with the shield forms a closed loop LC circuit. The supply and receiving of the RF signal is performed at both ends of the capacitors of a specified line element 118.

The plural line elements 118 are respectively electrically and mechanically connected at both ends to the orifices 112, 112', and arranged at equal intervals concentrically along the periphery of the openings 114, 114'. The coupling position of the line elements 118 on the orifices 112, 112' is in the center of the ring segments formed on the orifices 112, 112' divided by the slits 116. The line elements 118 are maintained a specified distance from the inner surface of the tube 110.

The RF coil unit 108 is for example divided into eight equal parts by the slits 116. One of these equally divided units is hereafter referred to as a segment. The cylinder segments are comprised of eight of these equivalent segments.

Figure 1:
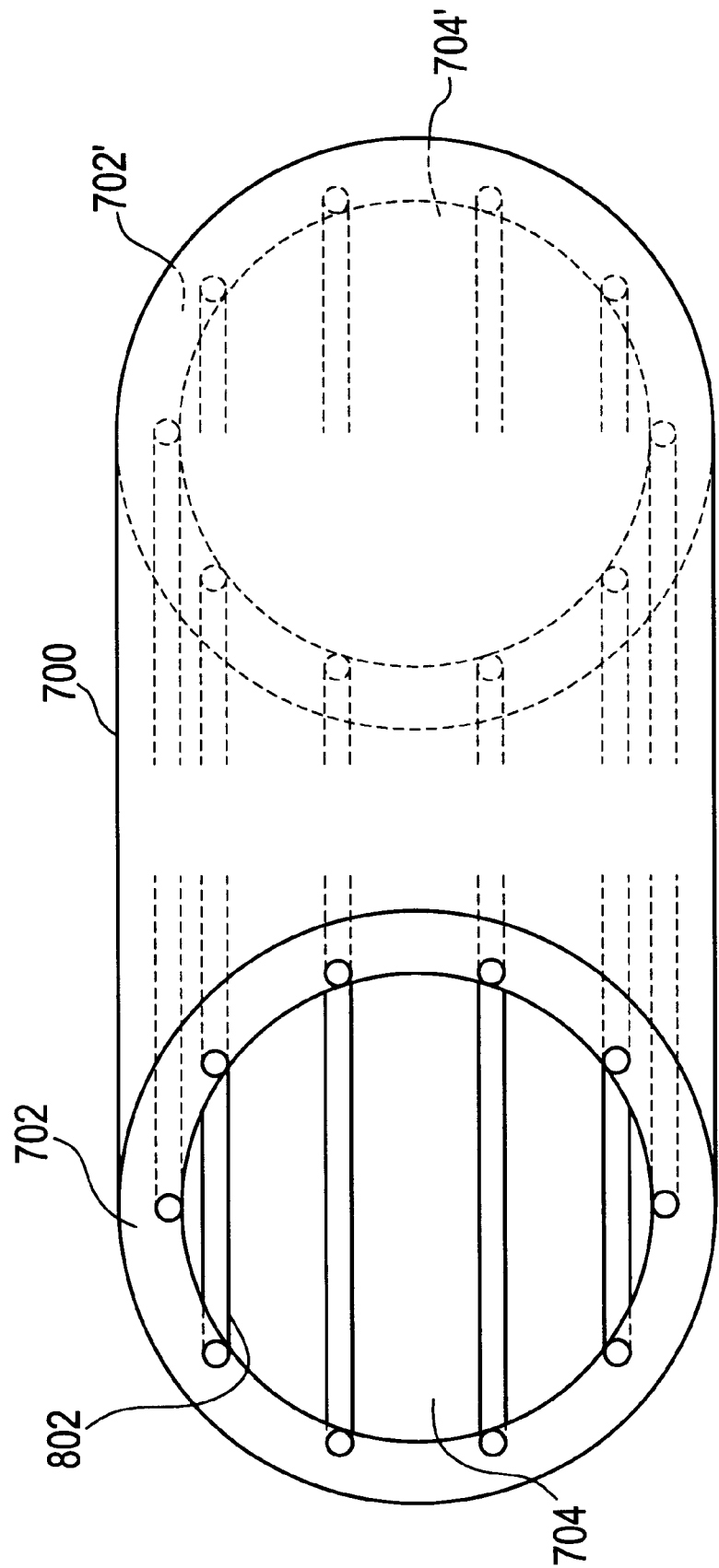
FIG. 1 is a pattern drawing of a TEM resonator RF coil.
Figure 2:
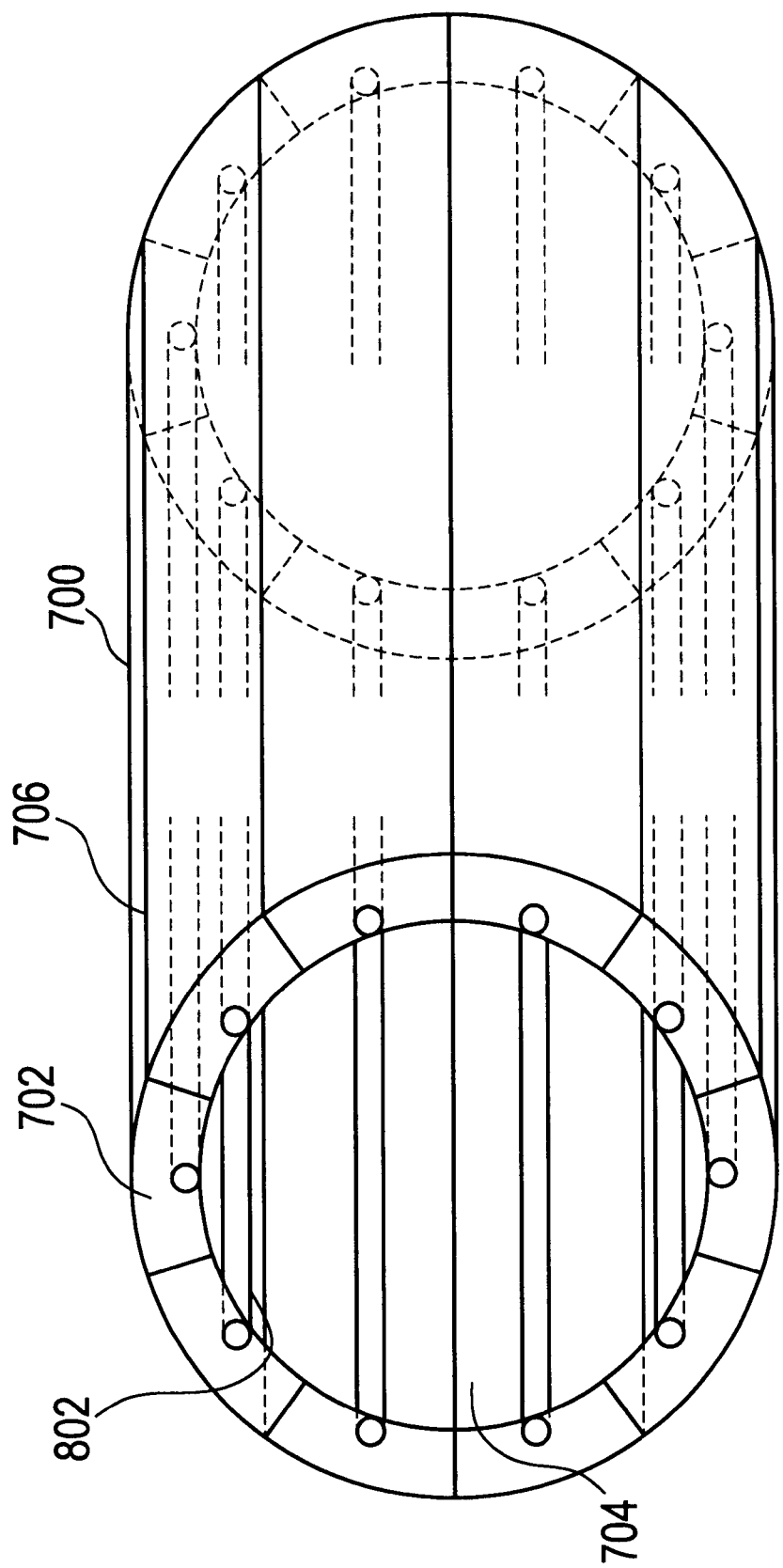
FIG. 2 is a pattern drawing of the TEM resonator RF coil.
Figure 3:
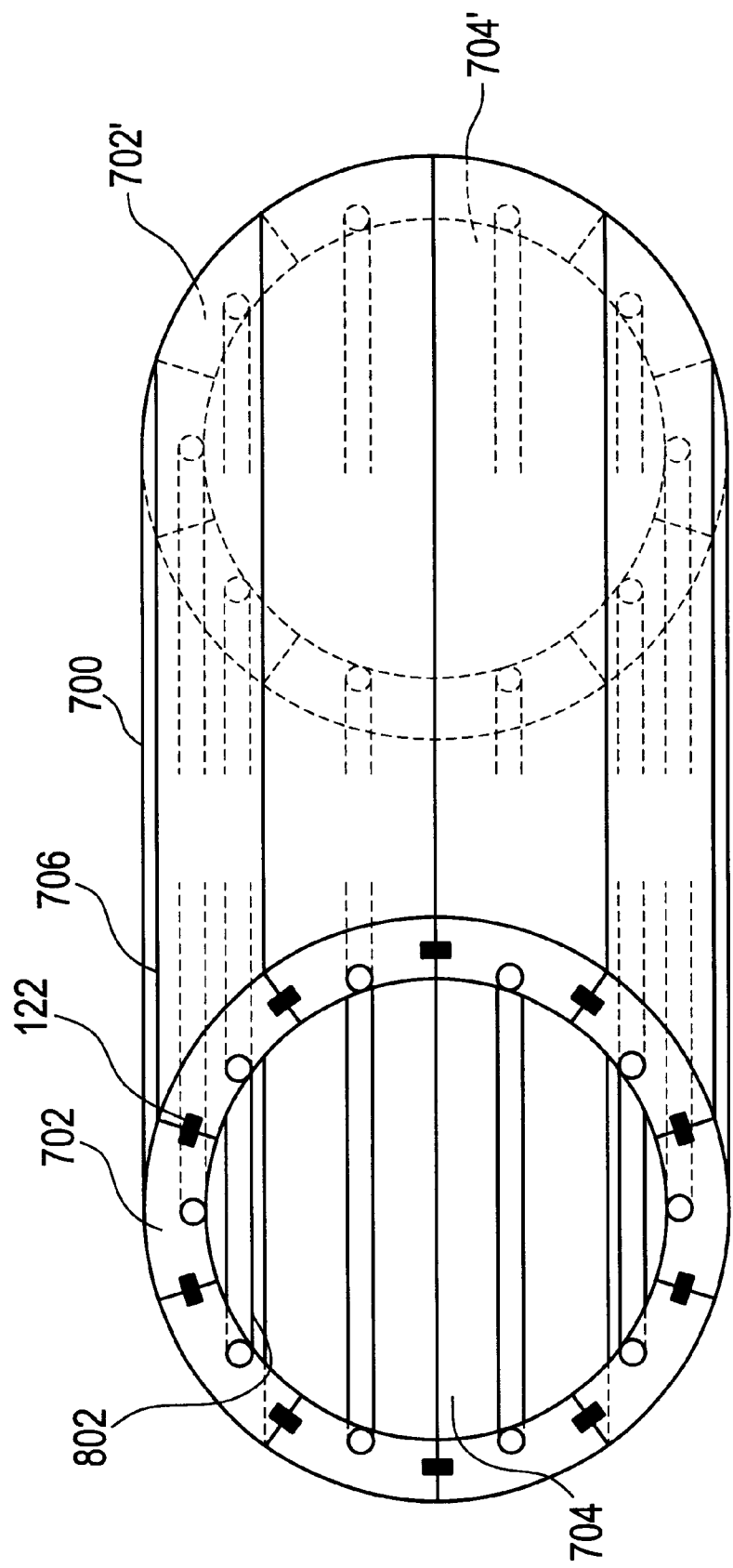
FIG. 3 is a pattern drawing of the TEM resonator RF coil.
Figure 4:
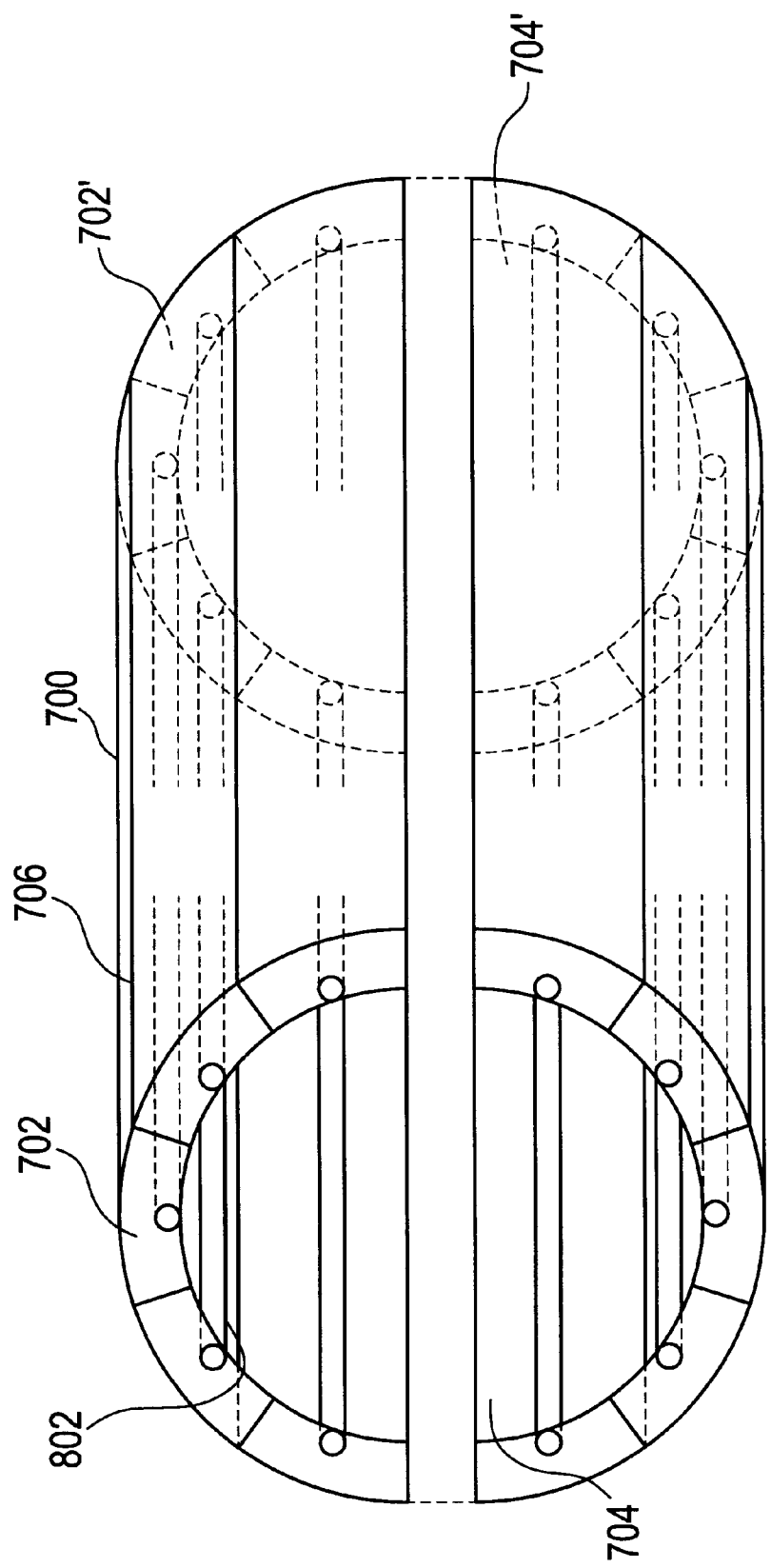
FIG. 4 is a pattern drawing of the TEM resonator RF coil.
Figure 5:
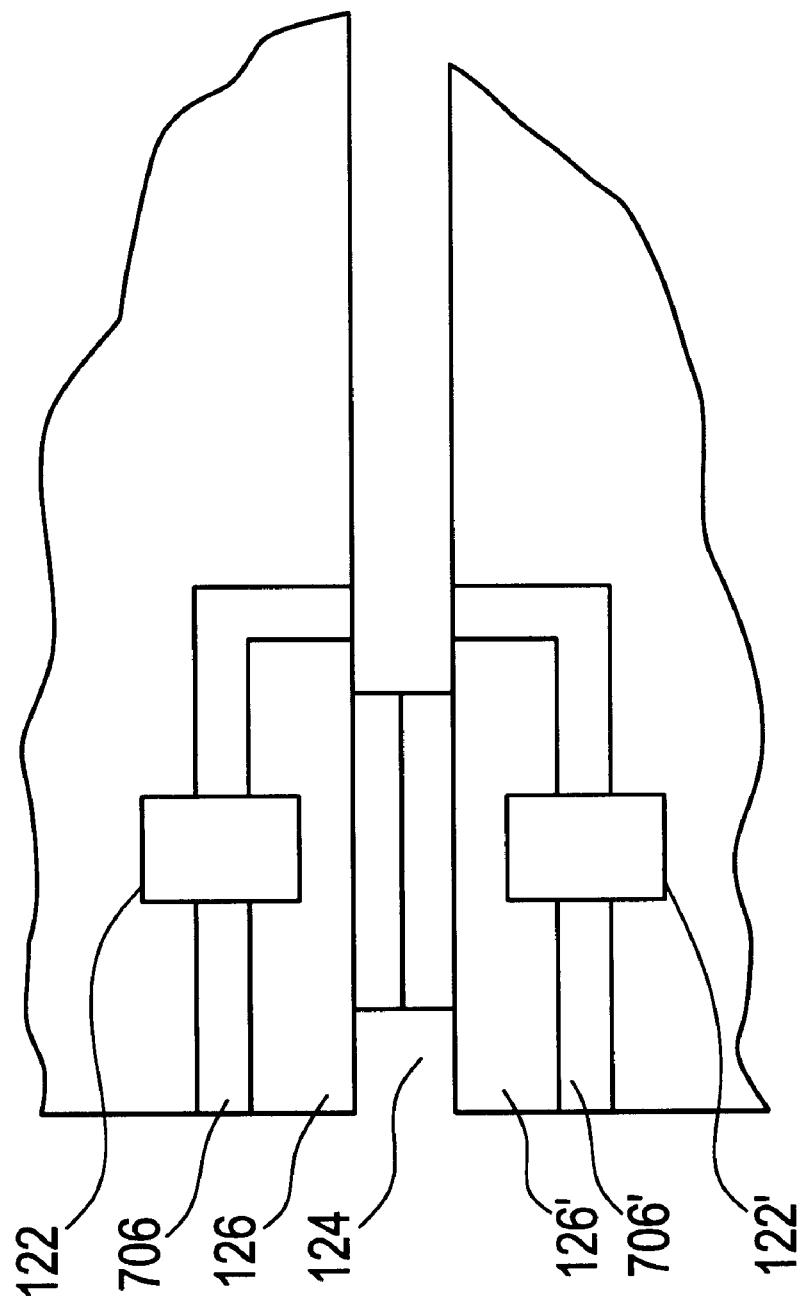
FIG. 5 is a pattern drawing of a portion of the RF coil shown in FIG. 4.

The structures described above are all common to the RF coil shown in FIG. 2. In the RF coil 108, the eight ring segments formed at the orifices 112, 112 on both sides of the shield share a common conductor pattern and circuit components disposed on that pattern.

Figure 8:
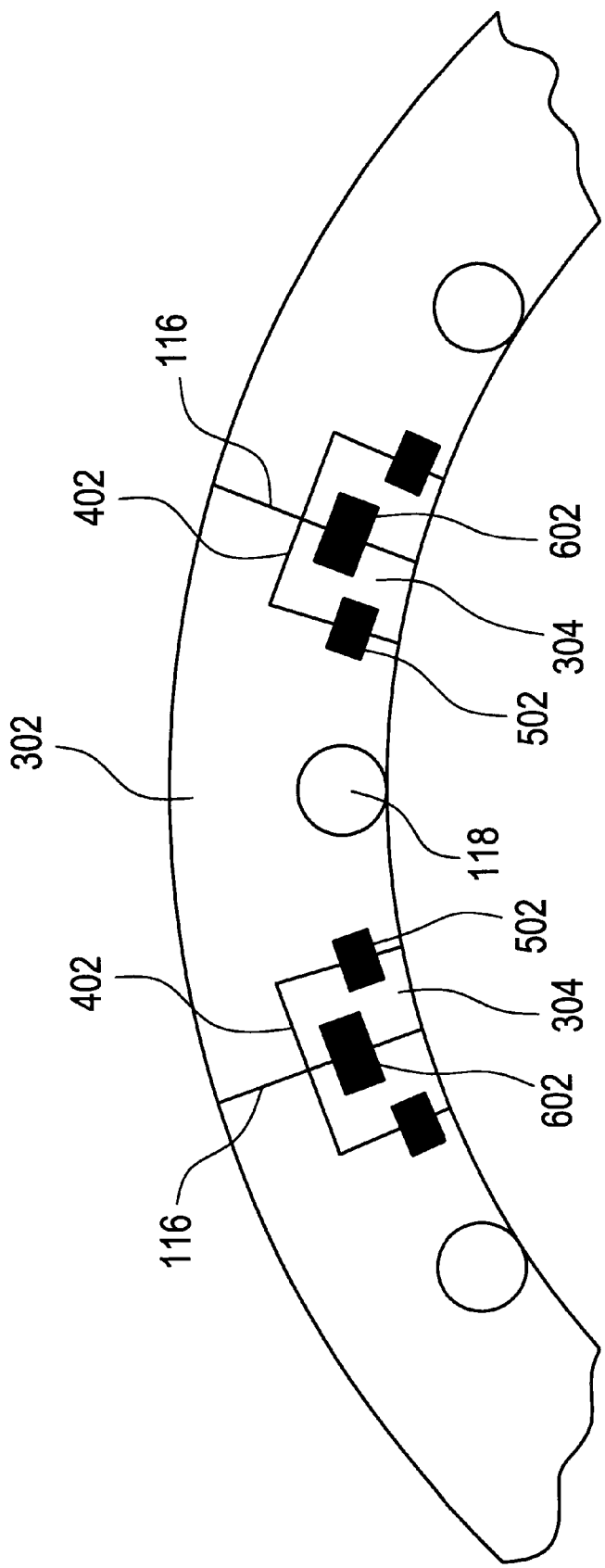
FIG. 8 is a pattern drawing of a portion of the RF coil shown in FIG. 7.

A front view of one ring segment and a portion of the adjoining ring segments are shown in FIG. 8. The conductor pattern for the ring segment, as shown in FIG. 8 has a main land 302 connected to the edges of the line element 118, and two sub lands 304 formed symmetrically on the both left and right sides of the main land 302. The main land 302 and the sub land 304 are separated by the slits 402.

The main land 302 is an example of an embodiment the first conductor pattern of the invention. The sub lands 304 are an example of an embodiment of the second conductor pattern of the invention.

The mainland 302 and the sub lands 304 are connected by a capacitor 502. The capacitor 502 is an example of the embodiment of the capacitor of the invention. A mica condenser having a sufficiently high impedance for example, in the 1 kilohertz to 10 kilohertz frequency range, and for example a sufficiently low impedance for example in the 128 megahertz frequency range, and having a capacitance for instance, of 1000 picofarads may be used as the capacitor 502.

The sub lands 304 separated from the sub land of the adjoining ring segments by the slit 116 are connected by a conductor 602 with the sub lands of the adjoining ring segments. Copper foil or a copper mesh sheet for example, may be used as the conductor 602.

The main land 302 and the sub lands 304 connected by the capacitor 502 are effectively an electrical short across the slit 402 in the high frequency range. The shorting of the slit 116 between the adjacent lands by the conductor 602, applies an equivalent value in the RF range to the plural line elements 118 connected at both ends to the orifices 112, 112'. The shield effect is therefore improved in the RF range, and operation is stabilized regardless of whether a load is present or not in the vicinity of the orifice 112, 112'.

The capacitor 502 on the other hand, has a sufficiently high impedance in the 1 kilohertz to 10 kilohertz range so that there is no flow of excess current on the outer periphery of the shield during application of the gradient magnetic field constituting the signal in that same frequency range. The effect that excess current exerts on a magnetic field can therefore be prevented.

Figure 9:
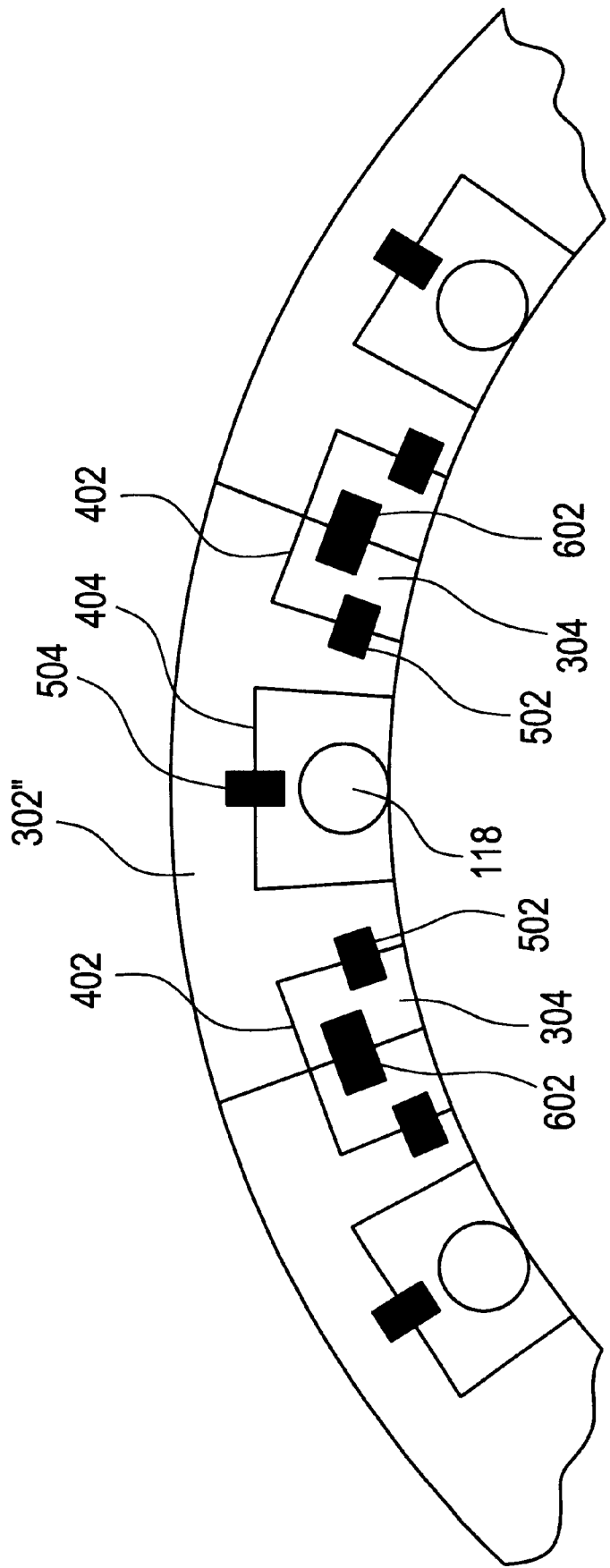
FIG. 9 is a pattern drawing of a portion of the RF coil shown in FIG. 7.

The conductive pattern and the components may be arranged in the ring segments as shown for example in FIG. 9. The main land 302 is divided into two segments by the slit 404 as shown in FIG. 9, forming the land 302' connecting to the edge of the line element 118, and the land 302" connecting to tube 110 of the shield, and the lands 302', 302" are connected by the capacitor 504. The capacitor 504 constitutes a portion of the LC circuit of the RF coil unit 108.

The bisymmetrical conductive pattern of the ring segments as shown in FIG. 8 and FIG. 9 are identical in all the ring segments. All of the segments therefore have identical circuit conditions, and circuit uniformity can therefore be maintained in all segments involving the center axis of the RF coil 108. The operating characteristics of the RF coil are therefore improved.

Figure 10:
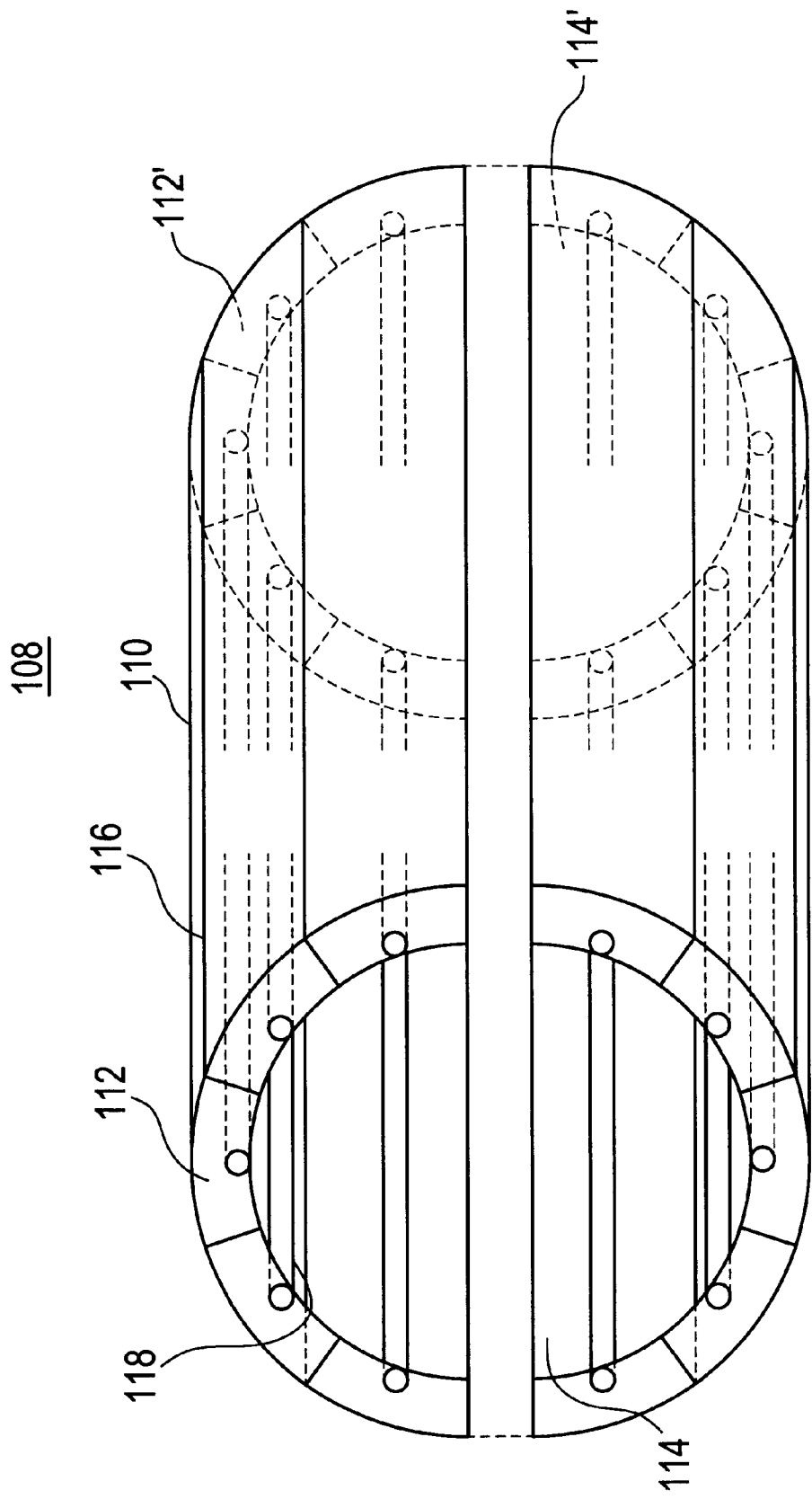
FIG. 10 is a pattern drawing of the RF coil shown in FIG. 6.

In the head coil type RF coil 108, has a structure separable into two portions along the axis and so is easily inserted on the head section of the imaging object 300 as shown in FIG. 10 and uniformity of the segment circuits can also be maintained even when both segments are joined by connectors.

Figure 11:
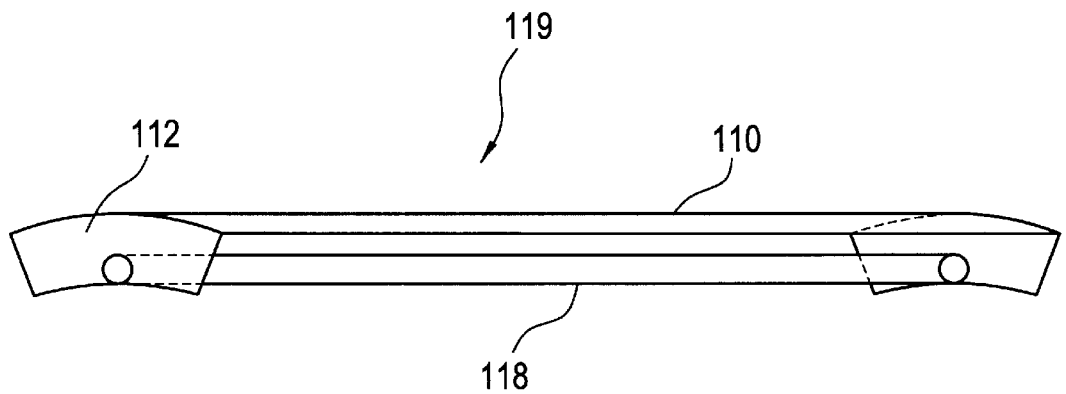
FIG. 11 is a pattern drawing of RF coil segments shown in FIG. 7.
Figure 12:
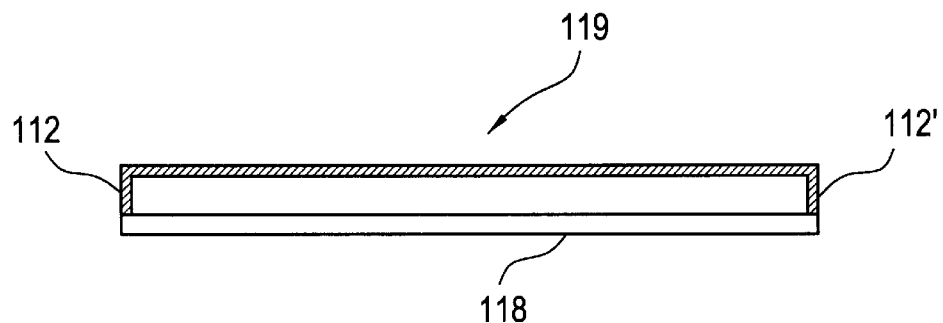
FIG. 12 is a vertical cross sectional view of the RF coil segments shown in FIG. 11.
Figure 13:
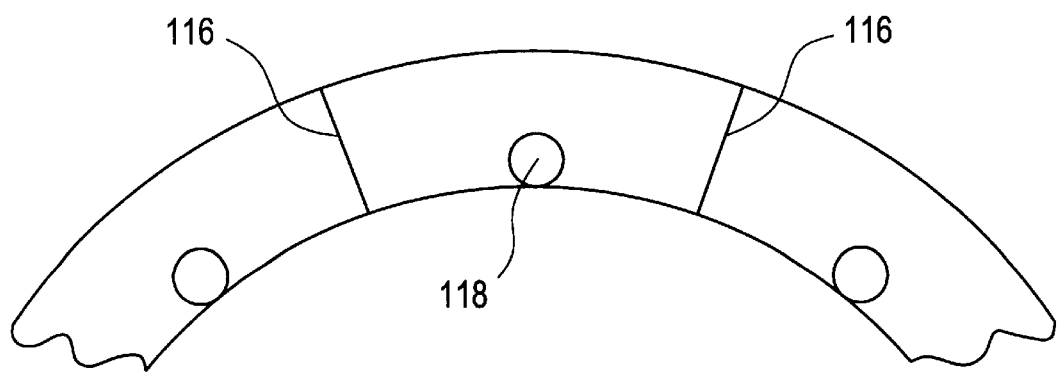
FIG. 13 is a pattern drawing of a portion of the RF coil shown in FIG. 7.

The RF coil unit 108 has a structure which can be disassembled in segment 119 units as shown in FIG. 11 and is preferable in the point that alignment to the same frequency can be easily performed in the manufacturing stage. A vertical cross sectional view of the segment 119 is shown in FIG. 12. The conductor pattern 112 of the orifices 112 on the segment 119 is not limited to the example shown in FIG. 8 or FIG. 9 and may overall comprise the single pattern as shown in FIG. 13.

Figure 14:
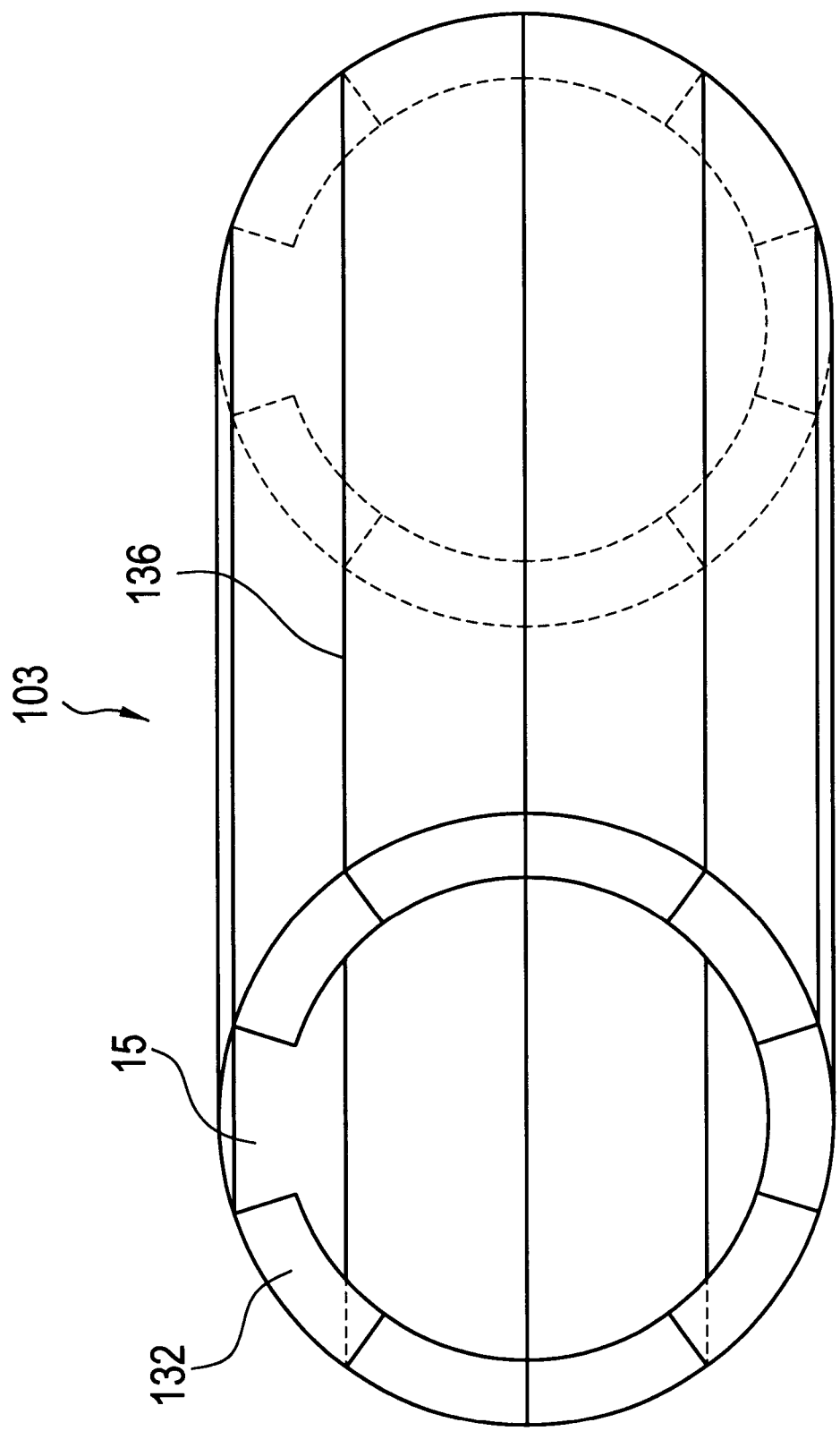
FIG. 14 is a pattern drawing of an alignment jig for the segment shown in FIG. 11.
Figure 15:
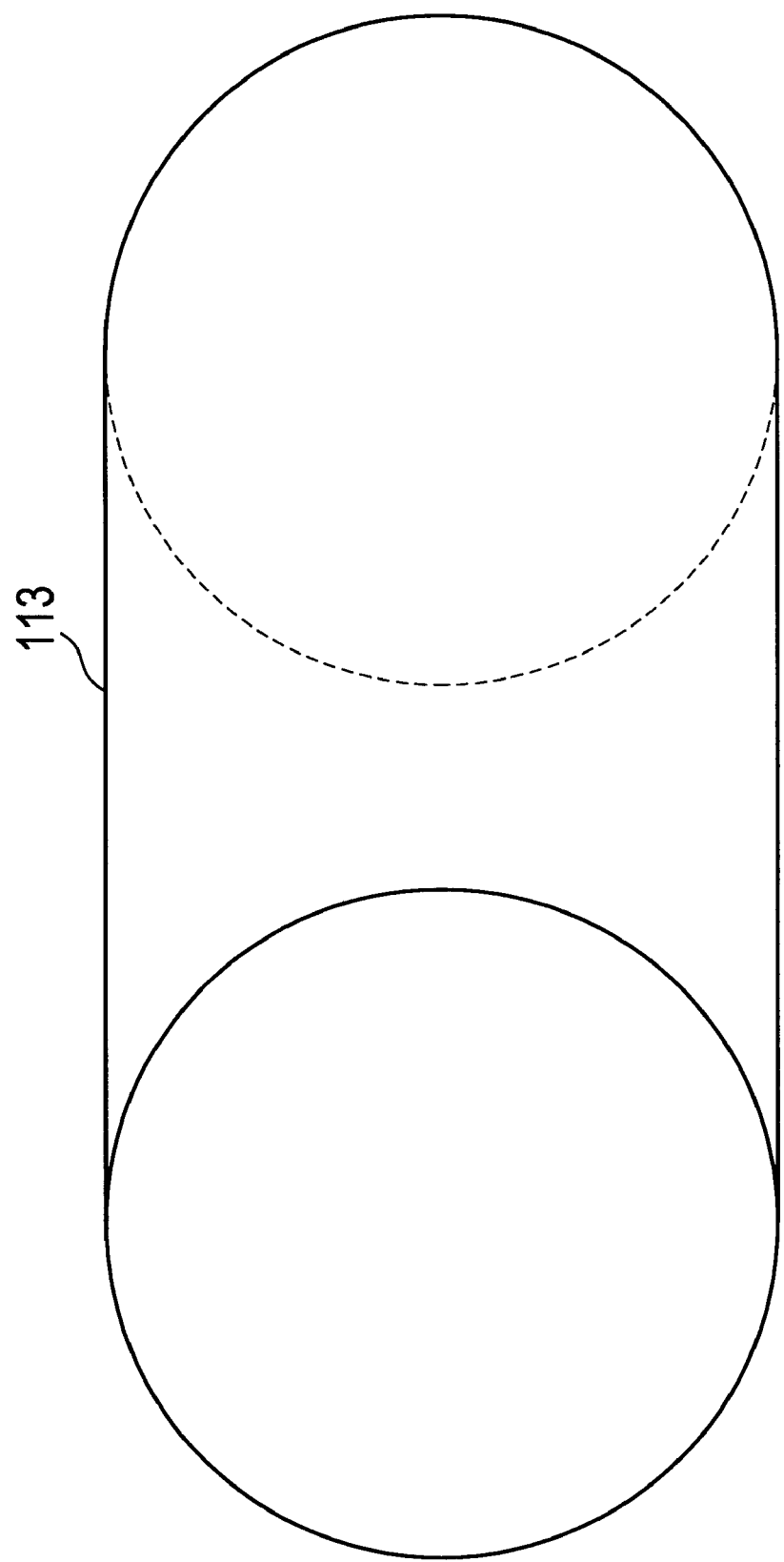
FIG. 15 is a pattern drawing of a support frame for installing the segments shown in FIG. 11.

When aligning such kind of segments 119 to the same frequency, a frequency alignment jig shown in FIG. 14 is utilized. The frequency alignment jig 103 shown in this figure forms a cylindrical shape.

The frequency alignment jig 103 is equivalent to an RF coil unit 108 as shown in FIG. 7 with one segment removed and also a shield with all line elements in other segments removed. However, the point with the segment removed is non-metallic and a non-magnetic concentric tube.

The frequency alignment jig 103 therefore has an orifice 132 comprised of ring segments with one cutout segment portion, and also has a slit 136. The cutout portion of the orifice 132 forms a fit portion 105 attached to the segment 119 during frequency alignment. The fit portion 105 has a shape and dimensions allowing fitting of the tube 110. The frequency alignment jig 103 is an example of an embodiment of the shield of the invention. The example of the embodiment relating to the shield of the invention is shown by means of the frequency alignment jig 103 structure.

For alignment to the same frequency, the segment 119 is fitted into the fit portion 105 of this frequency alignment jig 103 with a non-metallic and non-magnetic clamp, connected to the specified measuring equipment and the LC value of the circuit aligned. This alignment is mainly performed by adjusting the capacitance of the capacitor in serial with the line element 118.

The frequency alignment jig 103 can also be used in other applications to test if individual segments are defective or not to check for operating defects in the RF coil 108. The defect points can in this way easily be found. The defective segment can therefore then be repaired or replaced.

The RF coil unit 108 is assembled using all the segments 119 after alignment to the same frequency is complete. A cylindrical support frame 113 as shown in FIG. 10 is used in the assembly. The support frame 113 is an example of the embodiment of the support means of the invention.

Each segment is installed by means of the appropriate clamping jig on the inner side of the support frame 113 comprising the cylinder. The support frame 113 and the clamping jig are for example comprised of a non-metallic and non-magnetic material such as plastics. The fact that the support frame 113 can be divided into two portions along the axis is preferable for making the inserting and removing of the imaging object 300 on the completed RF coil easy to perform.

The imaging operation of this apparatus is now described. An example of the pulse sequence when imaging with this apparatus is shown in FIG. 16. This pulse sequence is the gradient echo method (GRE).

In other words, in the figure, (1) is the RF excitation $\alpha°$ pulse sequence in the GRE method. Also, (2), (3) and (4) are respectively, the slice gradient Gs, the readout gradient Gr, the phase encode gradient Gp and the gradient echo MR sequences. The $\alpha°$ pulse represents the center signal. The pulse sequence proceeds from left to right along the time axis t.

The spin $\alpha°$ excitation by the $\alpha°$ pulse is therefore performed as shown in FIG. 16. The flip angle $\alpha°°$is not more than 90 degrees. The excitation selected for the specified slice applied with the slice gradient Gs is performed at this time.

After $\alpha°$ excitation, spin phase decoding is performed by the phase encode gradient Gp. Next, the spin is first dephased by the readout gradient Gr, the spin then rephased, and a gradient echo MR generated. The gradient echo MR signal intensity is a maximum at the time point after echo time TE from the $\alpha°$ excitation. The gradient echo MR is collected as view data by the data acquisition unit 150.

A pulse sequence of this kind is repeated 64 to 512 times at the period TR (repetition time). The phase encode gradient GP is changed each time the pulse sequence is repeated, and different phase encoding performed each time. View data for views 64 to 512 filling the k space are obtained in this way.

An example of another pulse sequence for magnetic resonance imaging is shown in FIG. 17. This pulse sequence is an SE pulse sequence produced by the spin echo method.

In other words, (1) is an RF excitation 90 degree pulse and 180 degree pulse sequence by the SE method. In the same way, (2), (3), and (4) are respectively the slice gradient Gs, the readout gradient Gr, the phase encode gradient Gp and the spin echo MR sequences. The 90 degree pulse and 180 degree pulse respectively represent the center signals. The pulse sequence proceeds from left to right along the time axis t.

The 90 degree spin excitation is performed by the 90 degree pulse as shown in the same figure. The excitation selected for the specified slice applied with the slice gradient Gs is performed at this time. After 90 degree excitation at the specified time, 180 degree excitation by the 180 degree pulse or in other words, an inverted spin is performed. The slice gradient Gs is also applied at this time, and selective inversion of the same slice is performed.

The readout gradient Gr and the phase encode gradient Gp are applied in the period of 90 degree excitation and spin inversion. Spin dephasing is performed by the readout gradient Gr. Spin phase encoding is performed by the phase encode gradient Gp.

After spin inversion, the spin is rephased by the readout gradient Gr, and the spin echo MR generated. The spin echo MR signal intensity is a maximum at the time point after time TE from the 90 degree excitation. The spin echo MR is collected as view data by the data acquisition unit 150.

A pulse sequence of this kind is repeated 64 to 512 times at the period TR (repetition time). The phase encode gradient GP is changed each time the pulse sequence is repeated, and different phase encoding performed each time. View data for views 64 to 512 filling the k space are obtained in this way.

The pulse sequence utilizing in the imaging is not limited to the GRE method or the SE method and other methods such as FSE (Fast Spin Echo), fast recovery FSE (Fast Recovery Fast Spin Echo), and EPI (Echo Planar Imaging) may also be utilized as needed.

The data processing unit 170 performs two-dimensional inverse Fourier transforming of the view data of the k space and reconstructs a stepped image of the imaging object 300. The reconstructed image is stored in the memory or displayed on the display unit 180. The operating characteristics of the RF coil 108 are excellent so an image of high quality can be obtained.

In the above examples, the RF coil 108 was used for both sending and receiving, needless to say however, the RF signal of the RF coil 108 may also be exclusively for sending or exclusively for receiving.

Many widely different embodiments of the invention may be configured without departing from the spirit and the scope of the present invention. It should be understood that the present invention is not limited to the specific embodiments described in the specification, except as defined in the appended claim.

What is claimed is:

1. An RF coil, which is a TEM resonator RF Coil, comprising:

a circular cylindrical shield having at each end thereof, a ring shaped orifice extending inwardly perpendicular to an axis of said circular cylindrical shield;

a plurality of line elements extending from one ring shaped orifice to another ring shaped orifice at ends of said circular cylindrical shaped shield and arranged to be at equal intervals from each other and parallel to each other and to said axis;

a plurality of slits for dividing each ring shaped orifice of said circular cylindrical shield into a plurality of ring segments with a line element being located within each ring segment;

each said ring segment comprising:

a first conducting pattern connected to said line element located within each respective ring segment;

a second conducting pattern disposed symmetrically with respect to said line elements of adjacent ring segments;

a capacitor connecting said first conducting pattern with said second conducting pattern; and connector means for electrically connecting said second conducting patterns of adjacent ring segments.

2. The coil of claim 1, wherein said circular cylindrical shield is divided into two portions at locations of said slits.

3. The coil of claim 1, wherein said circular cylindrical shield is divided into a plurality of portions at locations of said slits.

4. The coil of claim 1, wherein said slit is non-conductive.

5. The coil of claim 1, wherein said capacitor has high impedance at 1 to 10 kiloherz, and low impedance at 128 megaherz, and is about 1000 picofarads.

6. A magnetic resonance imaging apparatus for forming images based on magnetic resonance signals acquired by applying a high frequency magnetic field to an object for imaging under a static magnetic field and a gradient magnetic field, wherein an RF coil is used for at least either applying said high frequency magnetic field or for acquiring said magnetic resonance signal, and is a TEM resonator coil, comprising:

a circular cylindrical shield having at each end thereof, a ring shaped orifice extending inwardly perpendicular to an axis of said circular cylindrical shield;

a plurality of line elements extending from one ring shaped orifice to another ring shaped orifice at ends of said circular cylindrical shield and arranged to be at equal intervals from each other and parallel to each other and to said axis;

a plurality of slits for dividing each ring shaped orifice of said circular cylindrical shield into a plurality of ring segments with a line element being located within each ring segment;

each said ring segment comprising:

a first conducting pattern connected to said line element located within each respective ring segment;

a second conducting pattern disposed symmetrically with respect to said line elements of adjacent ring segments;

a capacitor connecting said first conducting pattern with said second conducting pattern; and connector means for electrically connecting said second conducting patterns of adjacent ring segments.

7. The apparatus of claim 6, wherein said circular cylindrical shield is divided into two portions at locations of said slits.

8. The apparatus of claim 6, wherein said circular cylindrical shield is divided into a plurality of portions at locations of said slits.

9. The apparatus of claim 6, wherein said slit is non-conductive.

10. The apparatus of claim 6, wherein said capacitor has high impedance at 1 to 10 kiloherz, and low imedance at 128 megaherz, and is about 1000 picofarads.

* * * * *